United States Patent [19]

Nelligan

[11] 4,068,180

[45] Jan. 10, 1978

[54] METHODS AND APPARATUS FOR ENHANCING RESOLUTION IN PULSE ANALYSIS

[75] Inventor: William B. Nelligan, Danbury, Conn.

[73] Assignee: Schlumberger Technology Corporation, New York, N.Y.

[21] Appl. No.: 734,784

[22] Filed: Oct. 22, 1976

[51] Int. Cl.² .................. H03K 5/153; H03K 5/18
[52] U.S. Cl. ............................ 328/109; 307/232; 307/234; 328/137
[58] Field of Search ............... 307/232, 233 R, 234; 328/109, 110, 112, 119, 137, 139, 129, 130

[56] References Cited

U.S. PATENT DOCUMENTS

3,686,634   8/1972   Malchman et al. ............ 328/109 X
3,761,887   9/1973   Foster et al. .................. 328/109 X Primary Examiner—John Zazworsky

[57] ABSTRACT

Methods and apparatus are disclosed for selecting, among input signals, those which are time-spaced from each other by more than a predetermined time interval. Clock pulses are continuously applied to a pulse counter, and a predetermined count signal is produced each time the counter reaches a predetermined count. The counter is reset upon occurrence of either an input signal or a predetermined count signal. The order of occurrence of the input signals and of the predetermined count signals is memorized, and a validation signal is produced for each input signal which is directly preceded and followed by a predetermined count signal. Signals distorted by pile-up effect can thus be rejected.

28 Claims, 6 Drawing Figures

METHODS AND APPARATUS FOR ENHANCING RESOLUTION IN PULSE ANALYSIS

BACKGROUND OF THE INVENTION

1. Field of the Invention

The present invention relates to methods and apparatus for selecting, among successive signals, those which are spaced from each other by more than a predetermined time interval. The invention is particularly useful for enhancing the resolution in pulse analysis by rejecting signals which are distorted not only by overlapping or pile-up effect but also by chopping at the limits of gate intervals during which the signals are sensed.

2. Description of the Prior Art

Figure 1:
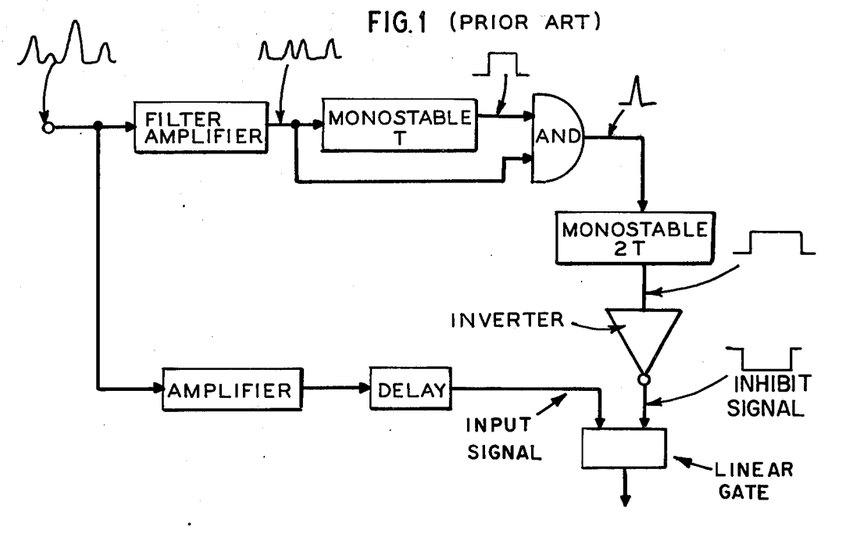
FIG. 1 illustrates the method of the prior art of rejecting signals too close to each other and shows a schematic diagram, in block form, of the apparatus of the prior art.

Various methods and devices have been proposed for rejecting signals which are too close to each other. In the most commonly used method signals to be selected trigger a monostable, which delimits a "dead" time interval immediately following each signal. If a second signal occurs during the "dead" time interval initiated by a first signal, it will be rejected. As shown schematically in FIG. 1, signals to be selected follow two separate channels. In the first channel, signal are amplified, suitably delayed and applied to the signals input of a linear gate which forms the common end of the two separate channels. In the second channel, signals are first differentiated by a filter-amplifier and then each differentiated pulse triggers a first monostable, which starts a "dead" time interval T delimited by a square-wave signal. The differentiated pulses are applied to one of the two inputs of an AND-gate, while the other input receives the square-wave signals. Signals at the output of the AND-gate are applied at the input of a second monostable starting a square-wave signal of width 2T. A square-wave signal 2T is obtained at the output of the second mono-stable only if a second signal has occurred within the "dead" time interval T initiated by a first signal. The square-wave signal delivered at the output of the monostable 2T is then inverted to obtain an inhibit signal which is applied to the control input of the linear gate common to the two separate channels followed by the signals to be selected. A validation signal level is present at the control input of the linear gate only when there is no square-wave inhibit signal at the output of the monostable 2T, and so only if the signal at the signal input is outside the "dead" time intervals of length T. Consequently, a signal is obtained at the output of the linear gate only if this signal is separated from the preceding signal by a time interval larger than the "dead" time interval T.

Devices of the prior art work satisfactorily when the frequency of repetition of signals is not very high, so that only pairs of closely spaced pulses need be considered and the occurrence of triplets, quadruplets and higher orders of closely spaced pulses can be ignored. Moreover, the components used in the apparatus of the prior art, especially the monostable device, are not reliable when submitted to large changes of environmental conditions. Particularly, the length of the "dead" time intervals can vary to a non-negligible extent as a function of temperature.

Accordingly, it is an object of the present invention to provide new methods and apparatus for selecting, among signals, those which are spaced from one another by more than a predetermined time interval.

Another object of the invention is to provide methods and apparatus for selecting among input signals, during preselected time periods, those input signals which are spaced from each other and from the limits of said time periods by more than a predetermined time interval.

SUMMARY OF THE INVENTION

In accordance with the invention, a timing means is driven from a reset condition toward a predetermined final condition and a minimum interval signal is generated upon each occurrence of the predetermined final condition. The timing means is reset to its reset condition upon each occurrence of either an input signal or a minimum interval signal. Input signals are selected only if they are directly preceded and followed by a minimum interval signal.

More specifically, clock pulses are continuously applied to counting means and a predetermined count signal is produced each time the counting means reaches a predetermined count. The counting means is reset to a reset count upon occurrence of either an input signal or a predetermined count signal. Input signals are selected only if they are directly preceded and followed by a predetermined count signal.

In accordance with a preferred embodiment of the invention, the order of occurrence of the input signals and of the predetermined count signals is memorized, and a validation signal is produced for each input signal which is directly preceded and followed by a predetermined count signal. A gate is then opened for the validated signal by the validation signal. The arrival of the validated signal at the gate is synchronized with the opening thereof, and the duration of the validation signal is substantially the same as the duration of the validated signal.

A similar technique can be used to reject, among input signals, those which are too close to each other and to the limits of gate intervals during which the input signals are sensed. In that case, gate signals are generated at the beginning and at the end respectively of the gate intervals. The counting means is reset upon occurrence of either an input signal or a predetermined count signal or a gate signal. The order of occurrence of the input signals, of the predetermined count signals and of the gate signals is memorized and a validation signal is produced for each input signal which is directly preceded and followed by a predetermined count signal. Input signals distorted by pile-up effect and/or by chopping at the limits of gate intervals can thus be rejected.

The present invention, both as to its organization and its manner of operation, together with further characteristics thereof, may best be understood by reference to the following description taken in conjunction with the accompanying drawings.

DESCRIPTION OF THE PREFERRED EMBODIMENTS

Figure 2:
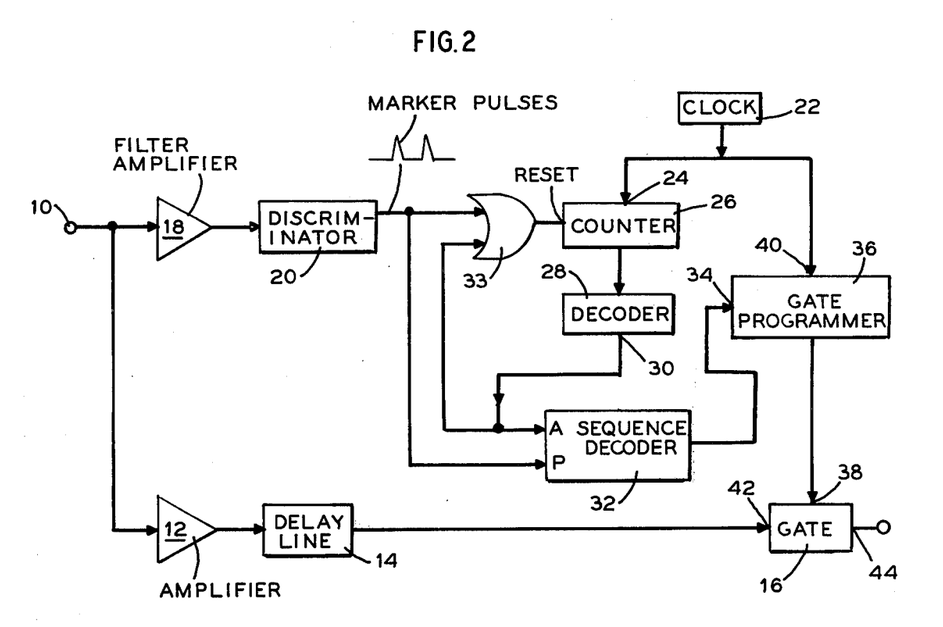
FIG. 2 illustrates the method of the invention and shows a first embodiment of the invention in schematic block diagram.

Referring to FIG. 2, there is shown a first embodiment of the invention, in block diagram form, which illustrates also the method of the invention.

Signals to be selected are applied to input 10 of the apparatus. These signals can be emitted by any kind of pulse signal generator. It can be for example a radioactivity detector whose output is connected to the input 10 of the apparatus shown schematically in FIG. 2. If the counting rate of the signals emitted by the detector is high, signals can be superimposed on each other or piled up and consequently an analysis of their characteristics, such as their amplitude, would be inaccurate. The purpose of the present invention is to reject signals which are too close to each other or, in other words, to select signals which are sufficiently time-spaced from each other. The time interval separating two successive signals has to be large enough so that no significant overlapping can occur between signals. Signals which are selected are not appreciably distorted and consequently the resolution of the signal analysis is greatly enhanced.

After having been applied to input 10, signals follow two separate channels. In one of these channels, signals are first amplified by an amplifier 12 and then delayed suitably by a delay line 14. Delayed signals are then applied to input 42 of a linear gate 16. In the second channel followed by the signals applied to input 10, signals are first differentiated and amplified by a high-pass filter amplifier 18 and then shaped by discriminator 20. The purpose of high-pass filter amplifier 18 and discriminator 20 is to obtain identical pulses at the output of the discriminator, derived from signals applied to input 10 and indicative of their time of occurrence. The high-pass filter amplifier 18 and discriminator 20 form together a pulse-shaping circuit. These two components are well known by one having ordinary skill in the art and are used in the prior art. Therefore, they do not need to be described in more detail.

Identical pulses obtained at the output of discriminator 20 are called "marker pulses." A clock-pulse generator 22 supplies clock pulses at the input 24 of a counter 26. Since clock 22 is continuously connected to counter 26, the counter keeps counting. At the beginning of the count, counter 26 is preset at a first predetermined count which can be for example the zero count. The output of counter 26 is connected to the input of a decoder 28. Decoder 28 inspects continuously the outputs of counter 26 and its function is to detect a second predetermined count in counter 26. When this second predetermined count is reached in counter 26, decoder 28 emits a signal at its output 30, which is connected to one of the two inputs of an OR-gate 33, the other input being connected to the output of discriminator 20 and being set by marker pulses. The output of OR-gate 33 is connected to the reset input of counter 26, so that the counter is reset to the first predetermined count each time a marker pulse occurs at the output of discriminator 20, that is to say each time a signal is applied at the input 10 of the apparatus. Counter 26 is also reset by signals emitted at the output 30 of decoder 28, that is to say each time the second predetermined count is reached in counter 26.

The difference between the first and second predetermined counts in counter 26 corresponds to a predetermined time interval. If the spacing between two consecutive marker pulses is less than the predetermined time interval, the second predetermined count is never reached in counter 26 since marker pulses reset the counter before it has time to reach the second predetermined count. In that case, there is no signal at output 30 of decoder 28. On the contrary, if there is no signal applied at input 10 of the apparatus, no marker pulses are produced and counter 26 is able to count each time from the first to the second predetermined counts without interruption. When the second predetermined count is reached, this event is detected by decoder 28; a signal is thus emitted at output 30 of decoder 28 to reset counter 26 by passing through OR-gate 33. The second predetermined count can be the count corresponding to the full capacity of counter 26.

Marker pulses emitted at the output of discriminator 20 are also applied to the input P of a sequence decoder 32, the other input A being connected to the output of decoder 30. Sequence decoder 32 is a memorizer that produces an output signal if and only if a proper or valid sequence has occurred at its inputs A and P.

Figure 5:
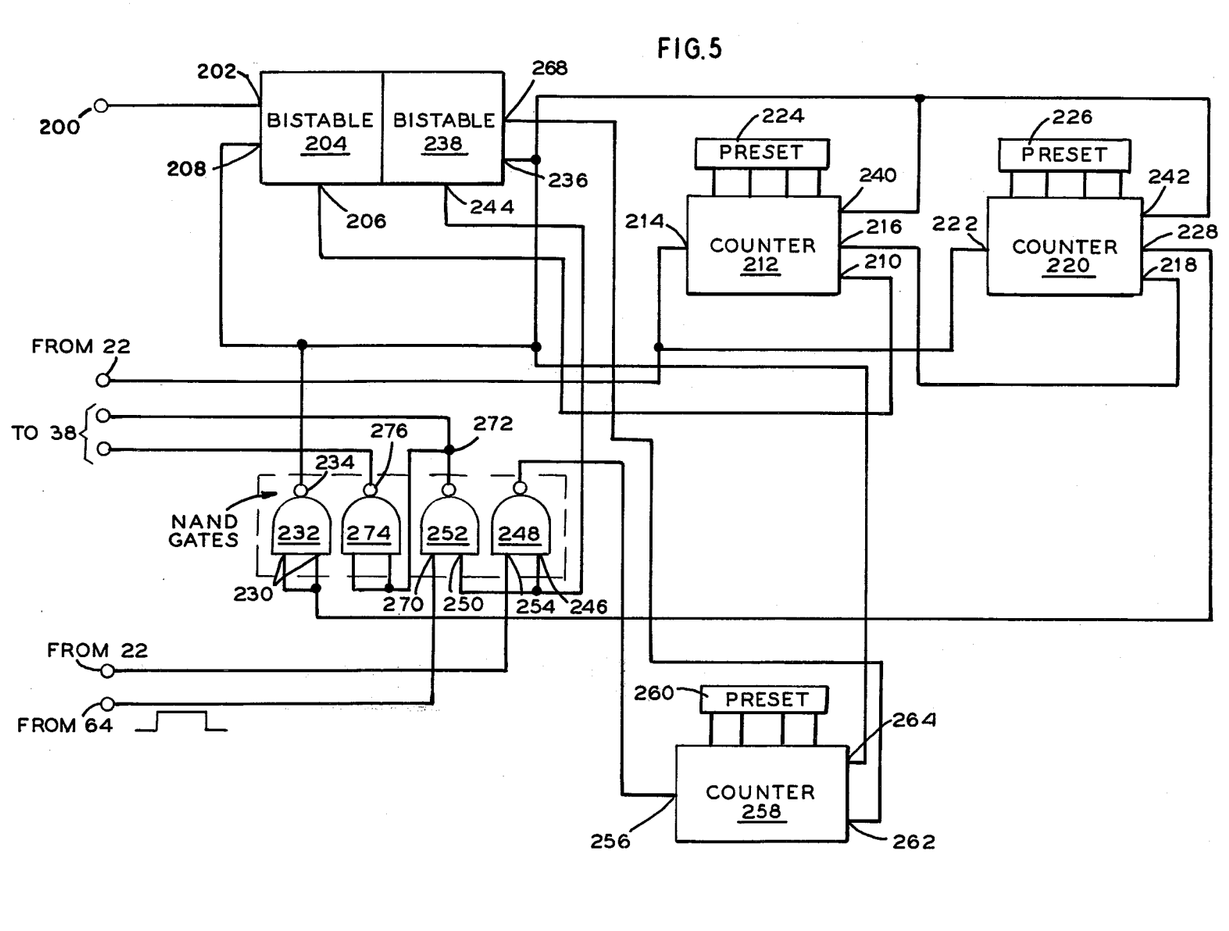
FIG. 5 is an embodiment of the gate programmer shown in FIGS. 2 and 3.

A proper sequence is a sequence consisting successively of a signal applied on the input A, a signal applied on the input P and finally a signal applied on the input A. In other words, a proper sequence comprises the detection by sequence decoder 32 of a marker pulse (input P) directly preceded and followed by the detection of a signal delivered by the output of decoder 30 (input A). Each time a valid sequence, designated later on by "sequence APA" is detected, sequence decoder 32 emits an output signal which is applied to input 34 of a gate programmer 36. One therefore realizes that a signal is received by gate programmer 36 whenever a signal applied to input 10 is separated from the preceding and following input signals by at least the time interval corresponding to the difference between the first and second predetermined counts. Gate programmer 36, shown in detail in FIG. 5, is a timer driven by pulses from clock 22 applied to input 40, so as to work in synchronism with counter 26. When gate programmer 36 receives from decoder 32 a signal indicating that a proper sequence APA has just been detected, it applies a validation signal to control input 38 of gate 16. The validation signal opens gate 16 at the same time as delay line 14 applies to input 42 the input signal corresponding to the marker pulse of the detected sequence. The input signal passes therefore through gate 16. As the delay introduced by line 14 cannot be adjusted with great precision, gate programmer 36 incorporates a finely adjustable delay which allows a good synchronism of the time of opening of gate 16 by the validation signal with the time of arrival of the validated signal at input 42. Moreover, the duration of the validation signal is adjusted in gate programmer 36 to be the same as the duration of the validated signal at input 42.

It now becomes apparent that the apparatus of FIG. 2 selects, among signals applied to input 10, those which are separated from the preceding and following input signals by more than a predetermined time interval.

Amplifier 12, delay line 14 and gate 16 are preferably linear. Therefore, signals appearing at output 44 of gate 16 are not deformed and can be used for the determination of their characteristics.

Figure 3:
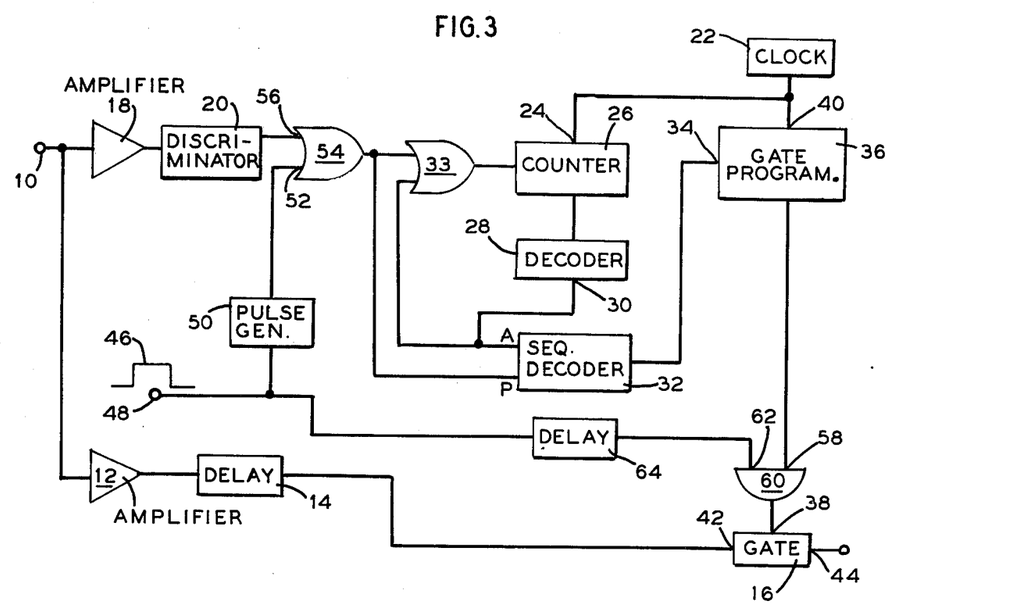
FIG. 3 shows a second embodiment of the invention, in block form, in which signals emitted by a detector are sensed only during predetermined time periods delimited by gate pulses, signals from the detector being selected as a function both of their proximity to each other and of their proximity to the limits of said time periods according to the method of the invention.

FIG. 3 shows the block diagram of a second embodiment of the invention in which signals to be selected are sensed or analyzed only during predetermined time periods. These time periods are usually delimited by square-waves referenced by 46 in FIG. 3 and emitted by a time gate device, such as a monostable device (not shown). It can happen that a signal to be selected occurs in coincidence with the leading or trailing edge of one of the square-wave signals 46. As a consequence, the signal is chopped by the edge of the square-wave signals and so is distorted. The purpose of the embodiment shown in FIG. 3 is to reject signals which have been distorted by chopping by one of the limits of the time period delimiting signal and/or by overlapping at the output of the source of signals to be sensed.

In accordance with the invention, gate pulses are produced at the beginning and the end of each square-wave signal and injected into the train of marker pulses derived from the signals to be sensed. The marker pulses are then processed in the same way as in the first embodiment shown schematically in FIG. 2. Consequently, if a signal applied at the input 10 is not separated from a gate pulse by at least an interval corresponding to the predetermined time interval, this input signal will not make a proper sequence APA happen. Consequently, the signal will be rejected or will not be selected. The rest of the input signals which occur during the square-wave signal will of course be validated if they are separated from preceding and following input signals by the predetermined time interval.

The second embodiment shown schematically in FIG. 3 includes the same elements as the first embodiment of FIG. 2. These elements are therefore designated by the same references as in FIG. 2. More precisely, identical elements are high-pass filter amplifier 18, discriminator 20, OR-gate 33, counter 26, gate programmer 36, clock 22, decoder 28, sequence decoder 32, amplifier 12, delay line 14 and gate 16. Input signals which are to be selected are applied, as in FIG. 2, at the input 10 of the apparatus. In the particular embodiment of FIG. 3, time periods during which signals to be selected are sensed or analyzed are delimited by square-wave signals 46 supplied by an external time gate device not shown in FIG. 3 and applied on an input 48. Square-wave signals 46 are applied to the input of a pulse generator 50. This generator supplies at its output gate pulses which correspond to the leading and trailing edges of the square-wave signals 46. This kind of pulse generator is commonly used in the art and comprises mainly a differentiating device and an inverter to invert one of the two pulses supplied by the differentiating device. If the result of the differentiation of the leading edge of a square-wave signal 46 is a positive signal, the differentiation of the trailing edge of the same square-wave signal is a negative signal. It is consequently necessary to invert the latter of these two pulses to get two positive pulses. Gate pulses emitted by generator 50 are applied to input 52 of an OR-gate 54, the other input 56 receiving the marker pulses which are derived from the signals to be sensed passing through filter amplifier 18 and discriminator 20. Pulses appearing at the output of OR-gate 54 are identical and indistinguishable by their origins; that is to say, there is no difference at the output of gate 54 between pulses derived from marker pulses and gate pulses derived from signals emitted by pulse generator 50. In other words, pulse generator 50 builds up pulses from edges of square-wave signals, these pulses being after gate 54 equivalent to marker pulses derived from signals to be selected. Signals emitted at the output of OR-gate 54 are treated in the same manner as marker pulses in the first embodiment shown in FIG. 2. These signals are applied on one of the two inputs of OR-gate 33 and also to the input P of sequence decoder 32. Counter 26 counts clock pulses applied to its input 24, from a first to a second predetermined count. The difference between the first and second counts corresponds to the predetermined time interval which is the minimum spacing permitted between successive signals. For example, the first predetermined count can be the zero count and the second predetermined count can correspond to the full capacity of counter 26. Decoder 28 emits a signal at its output 30 each time the second predetermined count is reached in counter 26. In that case, counter 26 is reset by the signal passing through OR-gate 33, the counter being also reset each time a pulse occurs at the output of OR-gate 54. Sequence decoder 32 detects valid sequences, each comprising the three successive events: (1) presence of a signal on input A of sequence decoder 32; (2) presence of a signal on input P; and (3) presence of a signal on input A. When such sequence APA is detected, a signal is emitted at input 34 of gate programmer 36 which works synchronously with counter 26 due to clock pulses applied to its input 40. When a valid sequence APA is detected, a validating pulse is generated by gate programmer 36 and applied to input 58 of an AND-gate 60, the other input 62 receiving square-wave signals 46 which have been suitably delayed by delay line 64. The purpose of this delay line is only to establish the correct coincidence between a validating pulse applied on input 58 of AND-gate 60 and a square-wave signal applied on input 62. The propagation time for a pulse to travel through pulse generator 50 and OR-gate 54, sequence decoder 32 and gate programmer 36, and the predetermined time established by counter 26, determines the value of the delay introduced by delay line 64. A validation signal is therefore applied at input 38 of gate 16 when a valid sequence APA has been decoded during one of the time periods delimited by square-wave signals 46.

The validation signal opens gate 16 at the same time as delay line 14 applies to input 42 the input signal corresponding to the marker pulse of the detected sequence. The input signal passes therefore through gate 16 and can then be supplied to a pulse analyzer, for example.

When a validation signal is generated for a gate pulse it also opens gate 16, but in this case there is no signal applied to input 42. As already mentioned, gate programmer 36 incorporates a delay which is adjusted so that the validation signal arrives at input 38 of gate 16 at the same time as the validated signal arrives at input 42. The duration of the validation signal is also adjusted to keep gate 16 open for only the time that the validated signal at input 42 is present.

It is now apparent that the apparatus of FIG. 3 selects among the signals applied to input 10 those which (1) occur during predetermined time periods, (2) are separated from the beginning and the end of said time periods by more than a predetermined time interval and (3) are separated from the preceding and following input signals by more than said predetermined time interval.

Figure 4:
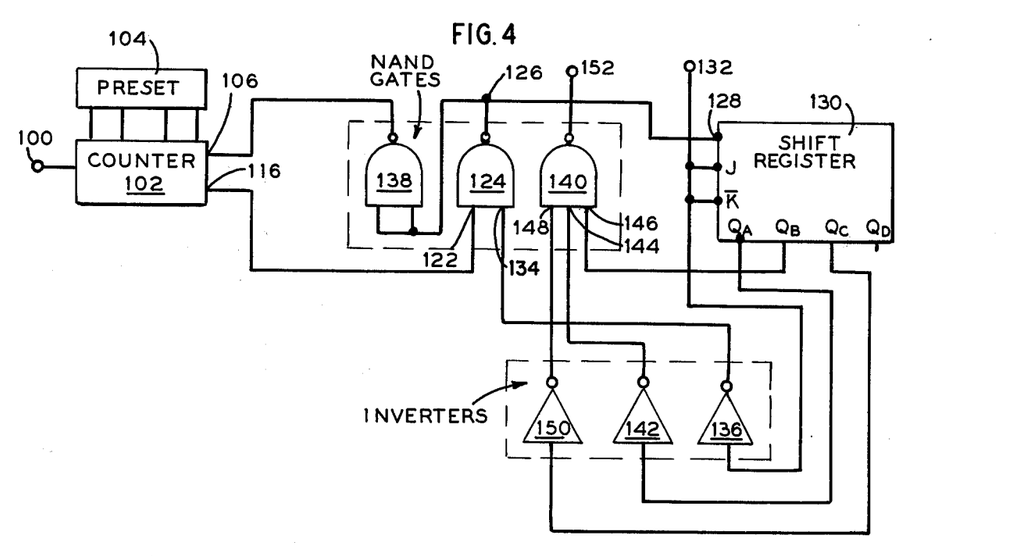
FIG. 4 shows in detail a possible digital embodiment of some common parts of the first and second embodiments, more precisely the counter, the decoder and the sequence decoder.

FIG. 4 shows in detail one of the possible embodiments of counter 26, decoder 28 and sequence decoder 32 of FIGS. 2 and 3. Clock pulses emitted by clock 22 are applied to input 100 of counter 102. Clock 22 can be an integrated part of the counter. Box 104 is the predetermination of the reset count and, in connection with the above description, allows the determination of said predetermined first count. Counter 102 can advantageously be an integrated circuit counter of the MSI (medium scale integration) type, such as the counter commercially and commonly designated by 54193. Counter 102 comprises four flip-flops. The maximum count which can be held by this counter is consequently equal to 15, and the minimum count is equal to zero. When clock pulses are applied to input 100 and when there are no pulses applied to reset input 106 of the counter, this latter counts continuously until it reaches the maximum count and is then reset to the first predetermined count determined by 104. In the example shown in FIG. 4, the second predetermined count is 15 since the full capacity of counter 102 is 15. The output 116 of counter 102 is connected to input 122 of NAND-gate 124. When a signal is obtained at output 116, that is to say, when counter 102 has reached the second predetermined count, a 0-signal is applied to input 122 of NAND-gate 124. This is the equivalent of a signal appearing at input A of sequence decoder 32 previously described. In that case, a 1-signal is obtained at output 126 of NAND-gate 124. This 1-signal is applied to input 128 of a shift register 130. This latter can be of the type commercially and commonly designated by 54195. Each time one of the inputs of NAND-gate 124 is in a 0-state, output 126 is in a 1-state. Input 128 of shift register 130 is its clock input. Marker pulses, which are derived from signals to be selected, are applied to signal input 132 which is connected to the J and $\overline{K}$ inputs of shift register 130. Outputs $Q_A$, $Q_B$, $Q_C$ and $Q_D$ of shift register 130 remain normally in a 0-state, unless a 1-signal is present on the inputs J and $\overline{K}$ when the signal at clock input 128 changes from the 0-state to the 1-state. Assuming first that no pulses have been applied to input 132, the state of the outputs of shift register 130 is a 0-state. Each time a signal is applied to input 128, that is to say, each time the output 126 of NAND-gate 124 changes from a 0-state to a 1-state, outputs $Q_A$ through $Q_D$ are shifted one step. Since these outputs are in a 0-state, shifting of one step does not change anything. Assuming now that a 1-state signal is applied to signal input 132, this signal is entered in shift register 130 when a 1-state appears at input 128. The state of first output $Q_A$ is then a 1-state. When the next "clock" signal is applied to input 128, the 1-state of output $Q_A$ is shifted to output $Q_B$. Again, with the arrival of signals to input 128, this 1-state is shifted to output $Q_C$ and finally to output $Q_D$. Output $Q_D$ is, in the described embodiment, not connected to any part of the circuit and consequently will not be considered any further. The three outputs $Q_A$, $Q_B$ and $Q_C$ provide an indication of arrival of marker pulses at signal inputs 132 and of the fact that counter 102 has reached the second predetermined count (full scale of counter 102). Consequently, shift register 130 indicates the appearance or not of a valid sequence which consists of the arrival of a marker pulse at input 132 immediately followed and preceded by the full scale count by counter 102. A valid sequence, designated previously by APA, corresponds to the following logical states of outputs of the shift register: $Q_A = 0$, $Q_B = 1$ and $Q_C = 0$. The signal pulse corresponding to the marker pulse applied to 132 and responsible for having $Q_B = 1$ is not rejected and is selected. Marker pulses applied to input 132 are also applied to input 134 of NAND-gate 124 through an inverter 136. The occurrence of a marker pulse at input 132 corresponds to a 0-signal at input 134. Output 126 of gate 124 is connected to the two inputs of a NAND-gate 138, used as an inverter, whose output is connected to the reset input 106 of counter 102. Each time a 0-signal appears at inputs 122 or 134, counter 102 will be reset by a 0-signal appearing at its input 106. Consequently, counter 102 is reset, on the one hand, when it has reached the second predetermined count corresponding to counting of its full scale and, on the other hand, when a marker pulse is applied to signal input 132. If marker pulses arrive at input 132 too close to each other, counter 102 will be reset each time before it is able to reach the second predetermined count. In that case, only successive 1-states are entered in shift register 130 and its outputs will never correspond to a valid sequence. Conversely, if no marker pulses are applied to input 132, counter 102 is reset each time it reaches the second predetermined count and in that case only successive 0-states are entered into shift register 130. No valid sequences are detected. In other words, shift register 130 memorizes the sequences of consecutive events. Valid sequences $Q_A = 0$, $Q_B = 1$ and $Q_C = 0$ are detected by a NAND-gate 140. Output $Q_A$ of shift register 130 is connected to input 144 of NAND-gate 140 through an inverter 142. Consequently, if $Q_A$ is in a 0-state, a 1-state will appear at input 144 of NAND-gate 140. Output $Q_B$ is connected directly to input 146 of NAND-gate 140. The third input 148 is connected to output $Q_C$ of shift register 130 through an inverter 150. If $Q_C$ is in a 0-state, a 1-state is applied to input 148. Consequently, a valid sequence $Q_A = 0$, $Q_B = 1$ and $Q_C = 0$ corresponds to a 1-state present at the three inputs 144, 146 and 148 of NAND-gate 140. In that case, a 0-signal appears at its output 152, which corresponds to the output of sequence decoder 32 of FIGS. 2 and 3. The three NAND-gates 138, 124 and 140 can be for example an integrated circuit commercially and commonly designated by 5410.

Figure 6:
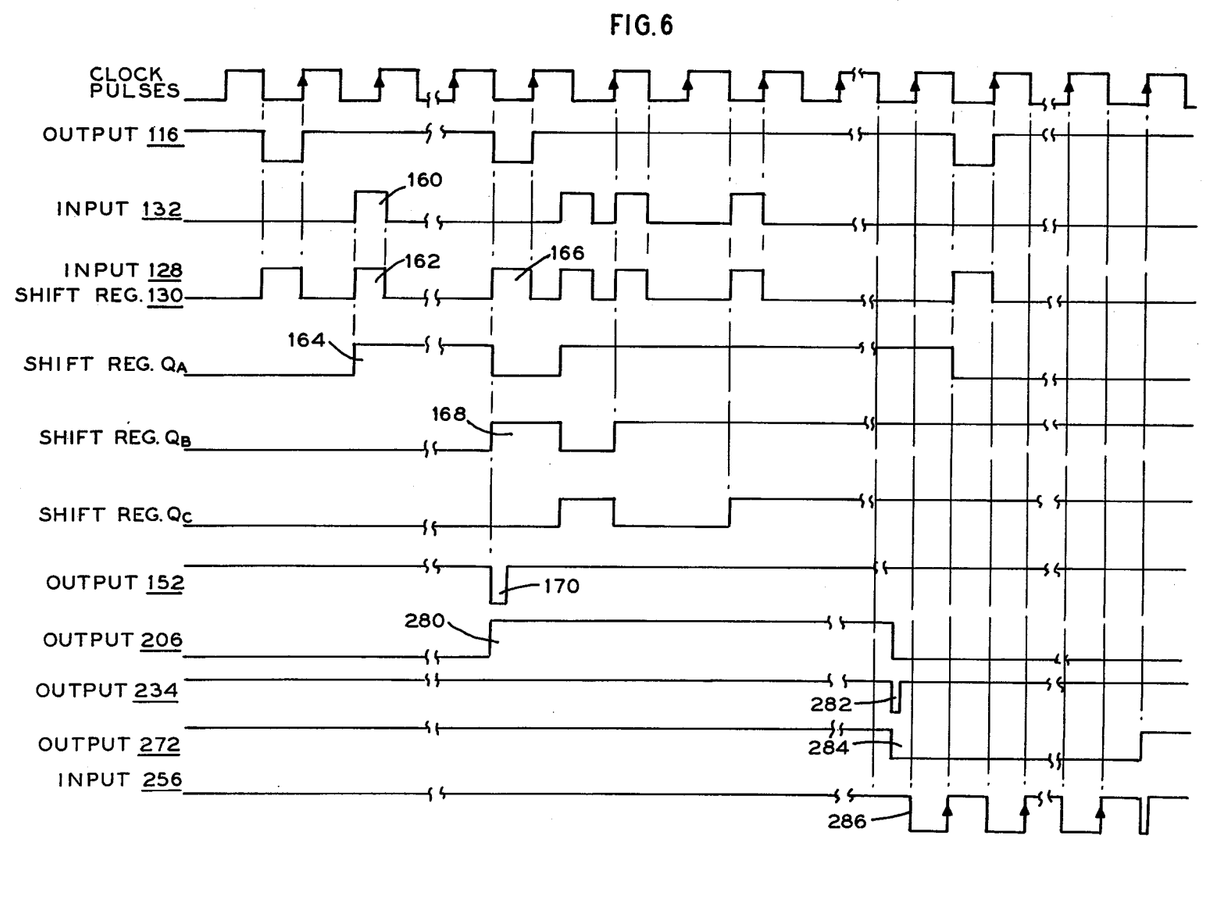
FIG. 6 is a diagram of signals appearing at several points of the embodiment shown on FIGS. 4 and 5.

Signals present at several points of the circuit of FIG. 4 are shown in FIG. 6. A signal is emitted by counter 102 at the output 116 thereof after each particular clock pulse from clock 22 which has advanced the counter to the state where the accumulated count is 15 (FIGS. 2 and 3). Signal marker pulses arriving at input 132 are represented. Assuming, for example that $Q_A$, $Q_B$ and $Q_C$ are each in the 0-state, then at the first coincidence between a marker pulse and a signal applied at input 128 of shift register 130, the signals in coincidence being referenced by 160 and 162 in FIG. 6, the output $Q_A$ of shift register 130 passes from a "0" state to a "1" state (signal 164). Outputs $Q_B$ and $Q_C$ remain in a "0" state at this time. At the arrival of the next signal 166 on input 128 of shift register 130, the "1" state of output $Q_A$ is shifted to output $Q_B$ (signal 168 in FIG. 6). Moreover, since there is no pulse present at input 132 of shift register 130, the output $Q_A$ passes to a "0" state. Consequently, the states of outputs $Q_A$, $Q_B$ and $Q_C$ are respectively 0, 1 and 0, which corresponds to a proper sequence. As a result, a signal 170 is emitted at the output 152 of the circuit of FIG. 4.

A problem may arise when relatively long pulses are used at inputs 128 and 132 of shift register 130. A spurious validation is then obtained if the pulses at input 128 and 132 overlap each other and the pulse at 128, caused by counter 102, arrives slightly before the marker pulse at 132. Since the J and $\overline{K}$ inputs of shift register 130 are at a 0-state when the clock input at 128 changes from the 0-state to the 1-state, the first output $Q_A$ assumes the 0-state and does not respond to the signal at input 132 because the signal at 128 is already in the 1-state. If a second signal then arrives at input 132 before another signal from counter 102, this second signal produces a 1-state at output $Q_A$ of shift-register 130. Since the first signal at input 132 has not caused the output $Q_A$ to assume the 1-state, the second signal will be validated if it is followed by a signal from the counter before another signal appears at input 132. This is a spurious validation because the two signals at input 132 did not have a counter signal between them.

The above problem can be solved by processing the marker pulses and the counter pulses, before they access the shift register, with a circuitry (not shown) that provides a priority status to the marker pulse so that in the event of an overlap with a pulse from counter 102, the counter pulse is suppressed and the output $Q_A$ of shift register 130 assumes a 1-state.

FIG. 5 is a possible embodiment of the gate programmer represented by 36 in FIGS. 2 and 3. The input 200 of the gate programmer receives pulses emitted by the sequence decoder 32 in FIGS. 2 and 3 or emitted at the output 152 of the embodiment shown in FIG. 4. Such pulses correspond to the detection of proper sequences APA. Input 200 of the gate programmer is connected to the input 202 of a bistable device 204 which comprises an output 206 and a reset input 208. Output 206 is connected to the input 210 of a counter 212, which receives on its input 214 clock pulses at a frequency higher than the frequency of the clock pulses applied to the input 100 of the embodiment of FIG. 4. As an example, pulses applied on input 214 have a frequency four times higher than the frequency of the clock pulses applied on input 100. These clock pulses of different frequencies can be emitted by the same clock 22 which, in that case, comprises two outputs and a frequency divider. One of these two outputs emits lower frequency clock pulses and the other emits higher frequency clock pulses. When a "0" or a "low state" signal, is applied to input 202 of bistable 204, a "1" signal, or a "high state" signal, appears at the output 206 thereof. This "1" signal applied to input 210 enables counter 212 so that higher frequency clock pulses applied at the input 214 are counted in counter 212. When this latter has counted a number of clock pulses corresponding to the full capacity thereof, a pulse is emitted at its output 216. This output is connected to the enable input 218 of counter 220. The two counters 212 and 220 are connected in tandem. Only during a time interval corresponding to the width of the signal emitted at the output 216, counter 220 is enabled and so counts higher frequency clock pulses applied to its input 222. In the particular embodiment shown in FIG. 5, counters 212 and 220 each comprise four bits. A count in each one of these counters can be only a four-bit count. To increase the precision of the time intervals defined by the two counters 212 and 220, they have been connected in tandem so that they allow together a count of 8 bits. It should be noted, at that point, that if the frequency of clock pulses applied to inputs 214 and 222 has been chosen higher than the frequency of the clock pulses applied to 100, it is for the purpose of increasing the precision of the device. Clock pulses with identical frequency could have been used.

Counters 212 and 220 include respectively preset circuitry 224 and 226 to predetermine in each one a preset count so that the counter is reset to this preset count. When counter 220 has counted a number of pulses corresponding to its full capacity, a "1" signal is emitted at its output 228. This output signal is applied at the same time at the two inputs 230 of a NAND-gate 232. Since the two inputs 230 are connected together, NAND-gate 232 is here used as an inverter. Consequently, at output 234 of NAND-gate 232 a "0" signal is obtained which is applied to the reset input 208 of bistable 204. As a consequence, output 206 changes to a "low state" signal or "0" signal which disables counter 212. At the same time, the output signal from NAND-gate 232 is applied to reset input 236 of a second bistable device 238 and respectively to the reset inputs 240 and 242 of counters 212 and 220. The "0" signal on inputs 240 and 242 of counters 212 and 220 causes the counters to be preset to the status determined by the preset input units 224 and 226 by the next clock pulse that arrives at inputs 214 and 222. After being preset, counters 212 and 220 are no longer in the full count state and the signal at output 228 of counter 220 returns to the "low state" signal or "0" signal state. As a consequence of the inversion by NAND gate 232, the signals at inputs 208 and 236 of bistables 204 and 238 are returned to the "high state" or "1" signal state. As an example, the two bistable devices 204 and 238 can be a dual J-K master-slave flip-flop, such as the integrated circuit commercially and commonly designated by 54S112. Counters 212 and 220 can each be a synchronous 4-bit counter, such as the integrated circuits commercially and commonly designated by 54S163.

When a "0" signal coming from output 234 of NAND-gate 232 is applied to input 236 of bistable 238, output 244 of bistable 238 reaches a "1" state. The "1" state signal is applied simultaneously to the input 246 of a NAND-gate 248 and to the input 250 of NAND-gate 252. The second input 254 of NAND-gate 248 receives lower frequency clock pulses emitted by clock 22. Again, the frequency of these clock pulses has been chosen, in this particular embodiment, four times lower than the frequency of the clock pulses feeding counters 212 and 220. When the output of bistable 238 has been switched to a "1" state, lower frequency clock pulses ae allowed to go through NAND-gate 248 and to reach the input 256 of a counter 258. As an example, this counter 258 can be a four-bit counter and can be the integrated circuit commercially and commonly designated by 54193. The counter includes a reset circuitry 260 allowing to preset the reset of counter 258 at a predetermined count. When counter 258 has counted from this predetermined count to a count corresponding to its full scale, an output signal is emitted at its output 262 and is applied to the clock input 268 of bistable 238. The signal at clock input 268 switches bistable 238 so that its output 244 is switched to the "0" state. The purpose of counter 258 is to determine the time interval during which output 244 of bistable 238 stays in a "1" state.

The "1" signal at the output 244 of bistable 238 is also applied to input 250 of NAND-gate 252 which receives on its second input 270 the square-wave signals delivered by an external time-gate device and applied to input 48 (FIG. 3). NAND-gate 252 is the equivalent of the AND-gate 60 represented in FIG. 3. When a square-wave signal coming from delay line 64 of FIG. 3 is in coincidence with a "1" signal delivered by output 244 of bistable 238 (when two "1" signals are applied on inputs 250 and 270 of NAND-gate 252), a "0" signal is obtained at output 272 of NAND-gate 252. This "0" signal is applied to input 38 of gate 16 of the embodiment of FIG. 3. The signal applied on input 38 opens gate 16. Depending on the type of gate 16 used, a "1" signal can be necessary to open the gate, instead of a "0" signal. For that reason, the embodiment represented in FIG. 5 comprises a NAND-gate 274 having its two inputs connected to output 272 in order to obtain at the output 276 a "1" signal. NAND-gate 274 is used here as an inverter.

NAND-gates 232, 274, 252 and 248 can be, as an example, the integrated circuit commercially and commonly designated by 5400.

Now that the embodiment of FIG. 5 has been described in detail, it could be useful to summarize its operation. When a proper sequence APA has been decoded by sequence decoder 32 of FIGS. 2 or 3, that is to say, when a pulse is applied to input 200 of the gate programmer of FIG. 5, bistable 204 is switched "on" so as to enable counter 212 which in turn, at the time it reaches its full scale count, enables counter 220. When counter 220 reaches its full scale count, bistable 204 is switched "off" and disables counter 212. Simultaneously, bistable 238 is switched "on" and opens gate 16 of FIGS. 2 and 3 only if, at this time, a square-wave signal is supplied by delay line 64 (external time-gate device) to NAND-gate 252. When bistable 238 is switched "on", it also enables counter 258. When counter 258 reaches its full scale count, it switches "off" bistable 238 which closes gate 16.

It now becomes apparent that, when a proper sequence APA has been decoded, gate 16 is opened with a delay corresponding to the time taken by counters 212 and 220 to reach their full scale counts from the counts preset in circuitries 224 and 226 respectively. Gate 16 then stays open during a time interval corresponding to the time taken by count 258 to reach its full scale count from the count preset in circuitry 260. The time of opening of gate 16, which must coincide with the time of arrival of the validated signal at input 42, is determined by the count in preset circuitries 224 and 226. The duration of opening of gate 16, which must be the same as the duration of the validated signal, is determined by the count in preset circuitry 260.

Signals present at some points of the circuit of FIG. 5 are shown in FIG. 6. When a proper sequence APA has been detected, a signal 170 is applied to input 200. The output 206 of bistable 204 switches from a "0" state to a "1" state illustrated by the square-wave signal 280. At the end of this square-wave signal, a reset signal 282 is applied to input 208 of bistable 204, to inputs 240 and 242 of counters 212 and 220, and also to input 264 of counter 258. Signal 282 presets counters 212, 220 and 258 to a predetermined count. Signal 282 also switches output 244 of bistable 238 from a "0" state to a "1" state, so that a "0" signal is present at the output 272 of NAND-gate 252. During the time interval corresponding to a "1" state of output 244 of bistable 238, low frequency clock pulses 286 are counted in counter 258, so as to determine the duration of the opening of gate 16.

While there have been described what are at present considered to be preferred embodiments of the invention, it will be obvious to those skilled in the art that various changes and modifications may be made therein without departing from the invention, and the claims are, therefore, intended to cover all such changes and modifications as fall within the true spirit and scope of the invention.

I claim:

1. A method for selecting, among input signals, those which are spaced from each other by at least a predetermined time interval, comprising the steps of:
   driving a timing means from a reset condition toward a predetermined final condition;
   generating a minimum interval signal upon each occurrence of the predetermined final condition;
   resetting the timing means to its reset condition upon each occurrence of either an input signal or a minimum interval signal; and
   selecting only those input signals which are directly preceded and followed by minimum interval signals.

2. A method for selecting, among input signals, those which are spaced from each other by more than a predetermined time interval, comprising the steps of:
   applying clock pulses to a pulse counting means;
   producing a predetermined count signal each time said counting means reaches a predetermined count;
   resetting the counting means to a reset count upon occurrence of either an input signal or a predetermined count signal; and
   selecting input signals which are directly preceded and followed by a predetermined count signal.

3. The method of claim 2, wherein said selecting step comprises:
   recording the order of occurrence of said input signals and said predetermined count signals;
   detecting the occurrence of only one input signal directly preceded and followed by a predetermined count signal; and
   producing a validation signal for said one input signal.

4. The method of claim 3, further comprising the step of opening gate means for the validated input signal in response to said validation signal.

5. The method of claim 4, further comprising the step of synchronizing the arrival of the validated input signal at the gate means with the opening of said gate means.

6. The method of claim 5, wherein said synchronizing step comprises delaying both the validated signal and the validation signal.

7. The method of claim 3, wherein the duration of the validation signal does not exceed the duration of the validated signal.

8. The method of claim 2, wherein input signals which are spaced from each other by more than a predetermined time interval are selected only during predetermined time periods.

9. The method of claim 8, further comprising:
   producing gate signals at the beginning and at the end, respectively, of said time periods; and
   resetting said counting means to said reset count upon occurrence of a gate signal.

10. The method of claim 9, wherein said selecting step comprises:
    recording the order of occurrence of said input signals, said predetermined count signals and said gate signals;

detecting the occurrence of only one input signal directly preceded and followed by a predetermined count signal; and producing a validation signal for said one input signal.

11. A method for selecting, among input signals, those which are spaced from each other by more than a predetermined time interval, comprising:

continuously applying clock pulses to counting means;

producing a predetermined count signal each time said counting means reaches a predetermined count;

resetting the counting means to a reset count upon occurrence of either an input signal or a predetermined count signal;

detecting the occurrence of only one input signal directly preceded and followed by a predetermined count signal; and opening gate means for said one input signal.

12. A method for selecting, among input signals during predetermined time periods, delimited by gate signals, those input signals which are spaced from each other and form a gate signal by more than a predetermined time interval, comprising the steps of:

applying clock pulses to pulse counting means;

producing a predetermined count signal each time said counting means reaches a predetermined count;

resetting the counting means to a reset count upon occurrence of either an input signal, a predetermined count signal or a gate signal; and selecting input signals which are directly preceded and followed by a predetermined count signal.

13. The method of claim 12, wherein said selecting step comprises:

recording the order occurrence of said input signals, said predetermined count signals and said gate signals;

detecting the occurrence of only one input signal directly preceded and followed by a predetermined count signal; and producing a validation signal for said one input signal.

14. The method of claim 13, further comprising opening gate means for the validated input signal in response to said validation signal only during said predetermined time periods.

15. A method for selecting, among input signals during predetermined time periods, those input signals which are spaced from each other and from the limits of said time periods by more than a predetermined time interval, comprising:

continuously applying clock pulses to a pulse counting means;

producing gate signals at the beginning and at the end, respectively, of said time periods;

producing a predetermined count signal each time said counting means reaches a predetermined count;

resetting the counting means to a reset count upon occurrence of either an input signal, a predetermined count signal or a gate signal, said predetermined time interval being defined by the difference between said predetermined count and said reset count;

detecting the occurrence of only one input signal directly preceded and followed by a predetermined count signal; and opening gate means for said one input signal during said predetermined time periods.

16. An apparatus for selecting, among input signals, those which are spaced from each other by more than a predetermined time interval, comprising:

means for counting clock pulses;

means for producing a predetermined count signal when said counting means reaches a predetermined count;

means for resetting said counting means to a reset count upon occurrence of either an input signal or a predetermined count signal, the difference between said predetermined count and said reset count defining said predetermined time interval; and means for selecting input signals which are directly preceded and followed by a predetermined count signal.

17. The apparatus of claim 16, wherein said selecting means comprises:

means for recording the order of occurrence of said input signals and said predetermined count signals; and means for detecting the occurrence of only one input signal directly preceded and followed by a predetermined count signal, said means producing a validation signal for said one input signal.

18. The apparatus of claim 17, further comprising gate means for passing the validated input signal in response to said validation signal.

19. The apparatus of claim 17, wherein said recording means comprises a shift register whose clock input is connected to receive said predetermined count signals and said input signals and whose signal input is connected to receive said input signals.

20. The apparatus of claim 19, wherein said detecting means produces said validation signal in response to a predetermined combination of outputs of said shift register.

21. The apparatus of claim 18, further comprising means for synchronizing the arrivals of the validation signal and the validated signal at said gate means.

22. The apparatus of claim 21, wherein said synchronizing means comprises:

means for delaying the input signals; and means for delaying the validation signals.

23. The apparatus of claim 17, further comprising means for adjusting the duration of the validation signals.

24. An apparatus for selecting, among input signals during predetermined time periods delimited by gate signals, those input signals which are spaced from each other and from a gate signal by more than a predetermined time interval comprising:

means for counting clock pulses;

means for producing a predetermined count signal when said counting means reaches a predetermined count;

means for resetting said counting means to a reset count upon occurrence of either an input signal or a predetermined count signal or a gate signal, said predetermined time interval being defined by the difference between said predetermined count and said reset count; and means for selecting input signals which are directly preceded and followed by a predetermined count signal.

25. The apparatus of claim 24, wherein said selecting means comprises:
means for recording the order of occurrence of said input signals, said predetermined count signals and said gate signals; and
means for detecting the occurrence of only one input signal directly preceded and followed by a predetermined count signal and producing a validation signal for said one input signal.

26. The apparatus of claim 25, further comprising:
first gate means for transmitting the validation signals during only said predetermined time periods; and
second gate means for passing the validated signals in response to the validation signals transmitted by said first gate means.

27. The apparatus of claim 25, wherein said memorizing means comprises a shift register whose clock input is connected to receive said predetermined count signals, said input signals and said gate signals, and whose signal input is connected to receive said input signals and said gate signals.

28. An apparatus for selecting, among input signals during predetermined time periods, those input signals which are spaced from each other and from the limits of said time periods by more than a predetermined time interval, comprising
means for counting clock pulses;
means for producing a predetermined count signal when said counting means reaches a predetermined count;
means for producing gate signals at the beginning and at the end, respectively, of said time periods;
means for resetting said counting means to a reset count upon occurrence of either an input signal or a predetermined count signal or a gate signal, said predetermined time interval being defined by the difference between said predetermined count and said reset count; and
means for selecting input signals which are directly preceded and followed by a predetermined count signal.

* * * * *

UNITED STATES PATENT AND TRADEMARK OFFICE
CERTIFICATE OF CORRECTION

PATENT NO. : 4,068,180
DATED : January 10, 1978
INVENTOR(S) : William B. Nelligan It is certified that error appears in the above-identified patent and that said Letters Patent are hereby corrected as shown below:

Col. 1, line 24 change "signal" to -- signals --.

Col. 1, line 25 change "signals" to -- signal --.

Signed and Sealed this

Tenth Day of November 1981

[SEAL]

Attest:

GERALD J. MOSSINGHOFF

Attesting Officer     Commissioner of Patents and Trademarks